United States Patent
Nowak et al.

[11] Patent Number: 5,973,508
[45] Date of Patent: Oct. 26, 1999

[54] VOLTAGE TRANSLATION CIRCUIT FOR MIXED VOLTAGE APPLICATIONS

[75] Inventors: Edward Joseph Nowak; Minh Ho Tong, both of Essex, Vt.

[73] Assignee: International Business Machines Corp., Armonk, N.Y.

[21] Appl. No.: 08/859,934

[22] Filed: May 21, 1997

[51] Int. Cl.[6] .............................................. H03K 19/0185
[52] U.S. Cl. ................................. 326/81; 326/68; 326/86
[58] Field of Search .................................. 326/68, 80–81, 326/82–83, 88, 121, 86; 327/333, 390, 589

[56] References Cited

U.S. PATENT DOCUMENTS

| | | |
|---|---|---|
| 4,080,539 | 3/1978 | Stewart . |
| 4,504,747 | 3/1985 | Smith et al. ............................... 326/83 |
| 4,723,082 | 2/1988 | Asano et al. ............................... 326/81 |
| 4,906,871 | 3/1990 | Iida . |
| 4,978,870 | 12/1990 | Chen et al. . |
| 5,075,581 | 12/1991 | Kamata . |
| 5,436,585 | 7/1995 | DiMarco . |
| 5,455,526 | 10/1995 | Runas . |
| 5,493,245 | 2/1996 | Kao et al. . |
| 5,534,798 | 7/1996 | Phillips et al. . |

FOREIGN PATENT DOCUMENTS

| | | | |
|---|---|---|---|
| 63-117513 | 5/1988 | Japan ....................................... | 327/333 |

*Primary Examiner*—Jon Santamauro
*Attorney, Agent, or Firm*—Eugene I. Shurko, Esq.; Scully, Scott, Murphy & Presser

[57] ABSTRACT

A voltage translation circuit for translating signals from a first voltage range to a second voltage range is disclosed. The voltage translation circuit includes a first inverter having an input that receives an intermediate signal and an output that provides an output signal having voltage levels that are latched to high and low states of the second voltage range. A second inverter is provided having an input connected to the first inverter output and an output connected to the first inverter input. A capacitor is also provided having an input that receives an input signal of the first voltage range and an output that provides the intermediate signal of the second voltage range. In addition, a pair of diodes are connected in series between a pair of voltage sources that provides high and low states of the second voltage range. The interconnected terminals of the pair of diodes are connected to the output of the capacitor.

16 Claims, 4 Drawing Sheets

VOLTAGE TRANSLATION CIRCUIT FOR MIXED VOLTAGE APPLICATIONS

BACKGROUND OF THE INVENTION

1. Field of the Invention

The present invention is directed to a voltage translation circuit for mixed voltage applications, and more particularly, to a voltage translation circuit that minimizes power dissipation thereof.

2. Discussion of the Prior Art

Advanced CMOS circuits use low operating voltages, such as 1.8 volts, while many other circuits operate at higher voltages, such as 3.6 volts (V). One of the key challenges for advanced CMOS designs is the ability to interface low voltage advanced CMOS circuits to circuits operating at higher voltages.

To operate devices having circuits that operate at different voltages, a voltage translation circuit is necessary to change one level of the operating voltage to another level. For example, a logic high level for CMOS 6X technology is 1.8V, while for other circuits, such as I/O (input/output) interface circuits or circuits connected to I/Os of the CMOS 6X devices, a logic high level is 3.6V. The higher 3.6V level, instead of the lower 1.8V level, may also be required for analog circuits connected to the CMOS 6X devices.

Figure 1:
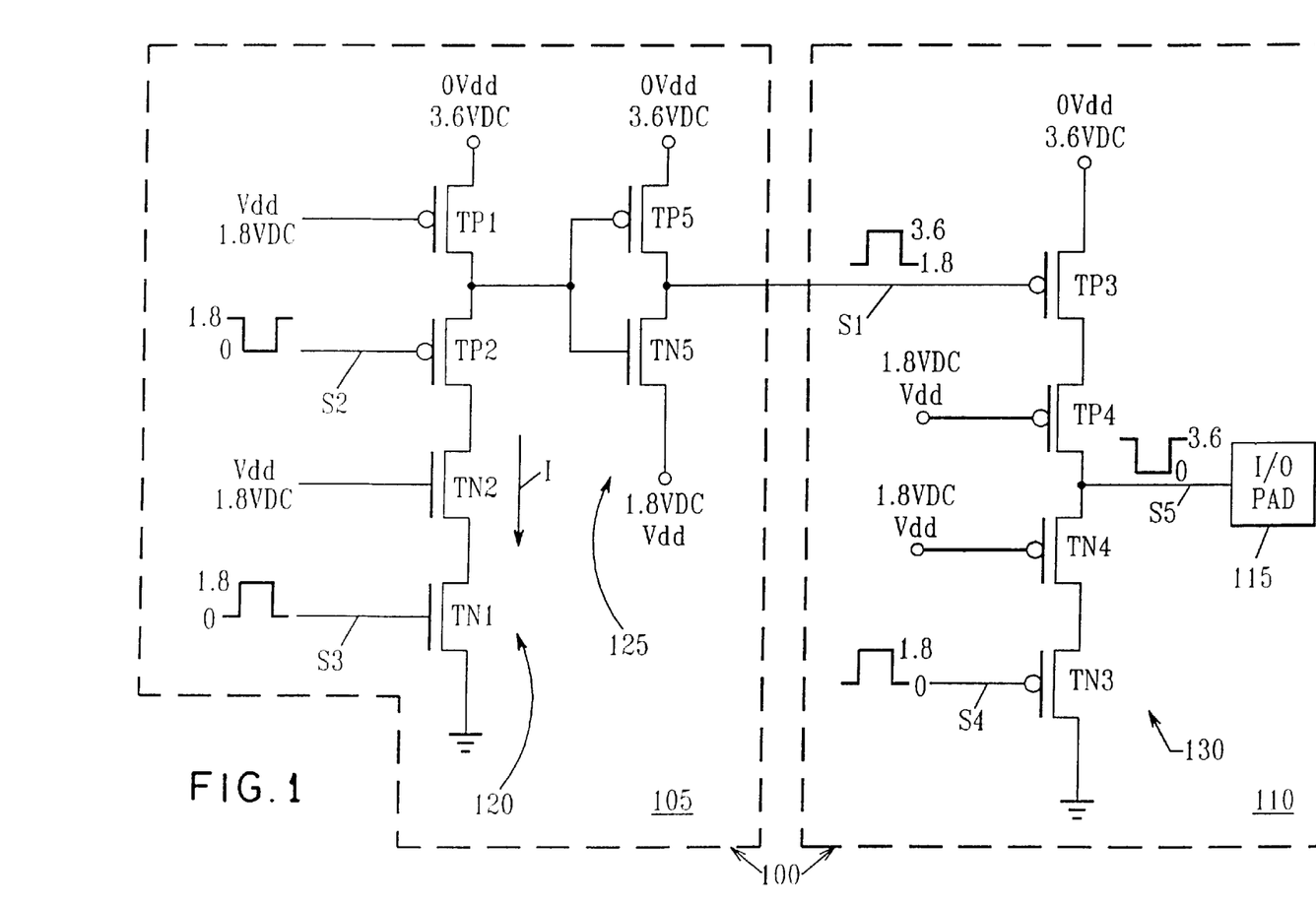
FIG. 1 shows a conventional voltage translation circuit.

FIG. 1 shows a conventional voltage translation circuit 100 having a level converter circuit 105 and an I/O interface circuit 110. The level converter 105 changes the level of a signal, for example, from a signal ranging from 0 to 1.8V and its complement applied to nodes S2 and S3, respectively, to a signal ranging from 1.8 to 3.6V provided on node S1.

The I/O interface circuit 110 receives the signal ranging from 1.8 to 3.6V provided on node S1, and another signal ranging from 0 to 1.8V applied to node S4, and provides an output signal to an I/O pad 115 ranging from 3.6 to 0V. The I/O pad 115 is connected to other circuits (not shown) that are configured to operate with signals ranging from 0 to 3.6V instead of signals ranging from 0 to 1.8V. Thus, the conventional voltage translation circuit 100 allows a device to have circuits that operate with signals ranging from 0V to 1.8V, 1.8V to 3.6V, and 0V to 3.6V.

As shown in FIG. 1, the conventional level converter circuit 105 includes a first stack 120 of four CMOS transistors and a second stack 125 of two CMOS transistors. The first stack 120 has two PMOS transistors TP1 and TP2 and two NMOS transistors TN1 and TN2. Herein, a PMOS transistor is designated by a circle at its gate, and has a source located above the gate and a drain located below the gate. In comparison, the locations of the source and drain of an NMOS transistor are reverse that of the PMOS transistor. That is, the NMOS transistor has its drain located above the gate and a source located below the gate.

The first PMOS transistor TP1 has its source connected to a DC (direct current) voltage of OVdd, e.g., 3.6 VDC, and its drain connected to the source of the second PMOS transistor TP2. The gate of the first PMOS transistor TP1 is pulled up to Vdd, which is 1.8 VDC for example, while the gate of the second PMOS transistor TP2, designated as node S2, receives a signal ranging from 1.8V to 0V. This signal is the complement of a signal ranging from 0V to 1.8V applied to node S3, which is connected to the gate of the first NMOS transistor TN1. The source of the first NMOS transistor TN1 is connected to ground, while its drain is connected to the source of the second NMOS transistor TN2. The drains of the second NMOS and PMOS transistors TN2, TP2 are connected together.

The interconnected drain and source of the first and second PMOS transistors TP1, TP2 are connected to gates of PMOS and NMOS transistors of the second stack 125, designated as TP5 and TN5, respectively. Similar to source of the first PMOS transistor TP1 of the first stack 120, the source of the PMOS transistor TP5 of the second stack 125 is connected to the OVdd bus, pulling up this source to 3.6VDC, for example.

The source of the NMOS transistor TN5 of the second stack 125 is connected to the Vdd DC power source, providing 1.8VDC, for example. The drains of the NMOS and PMOS transistors TN5, TP5 of the second stack 125 are connected together.

The interconnected drain and source of the NMOS and PMOS transistor TN5, TP5 of the second stack 125 are connected to a gate of a PMOS transistor TP3 of a third stack 130, which gate is designated as node S1. The third stack 130 is part of the I/O interface circuit 110 and includes two PMOS transistors TP3, TP4 and two NMOS transistors TN3, TN4.

The source of the first I/O PMOS transistor TP3 is connected to the OVdd bus, while its drain is connected to the source of the second I/O PMOS transistor TP4. As with the source of the first NMOS transistor TN1 of the first stack 120, the source of the first I/O NMOS transistor TN3 is connected to ground. The gate of the first I/O NMOS transistor TN3, designated as node S4, receives a signal that varies from 0V to 1.8V, which is similar to the signal applied to node S3.

The drain of the first I/O NMOS transistor TN3 is connected to the source of the second I/O NMOS transistor TN2. The gates of the second I/O NMOS and PMOS transistors TN4, TP4 are pulled up to Vdd, which is 1.8VDC for example. The drains of the second I/O NMOS and PMOS transistors TN4, TP4 are connected together. The interconnected drains of the second I/O NMOS and PMOS transistors TN4, TP4, designated as node S5, are connected to the I/O pad 115 and provide a signal ranging from 3.6V to 0V.

The operation of the conventional voltage translation circuit 100 is now described. A signal and its complement that include pulses that have low and high voltage levels are applied at nodes S3 and S2, respectively. Illustratively, the low and high voltage levels are 0V and 1.8V, respectively.

When S3 is at 0V, and consequently S4 is at 1.8V, then the first NMOS transistor TN1 of the first stack 120 is turned OFF, as any CMOS transistor would be OFF when its gate and source are at the same voltage level. Because TN1 is OFF, no current flows through the path TP1-TP2-TN2-TN1 of the first stack 120.

The first PMOS transistor TP1 of the first stack 120 is ON because its gate is connected to Vdd of 1.8VDC, which is less than the voltage OVdd of 3.6Vdc applied to its source. As a result of TP1 being ON while TN1 being OFF, which prevents current flow down the first stack 120, the gates of transistors TP5 and TN5 of the second stack 125 are pulled up to 3.6V (OVdd) through the ON first PMOS transistor TP1 of the first stack 120.

The transistors TP5 and TN5 of the second stack 125 are configured as an inverter that output 3.6V (OVdd) and 1.8V (Vdd), when its input is 1.8V and 3.6V, respectively. Thus, the 3.6V level at the gates of transistors TP5, TN5 when S3=low is inverted to result in a voltage level of 1.8V at node S1 of the interconnected drains of transistors TP5, TN5. This 1.8V level at node S1 is the low state of the translated signal.

In effect, the low state level of 0V at node S3, is translated to a new low state level of 1.8V at node S1, which is the output of the level converter circuit 105.

The voltage at node S1 is 1.8V when 3.6V is applied to the gates of the second stack transistors TP5, TN5 because the PMOS transistor TP5 is OFF and the NMOS transistor TN5 is ON. The PMOS transistor TP5 of the second stack 125 is OFF, since its source voltage OVdd of 3.6V is the same as its gate voltage. The NMOS transistor TN5 of the second stack 125 is ON, since its source voltage Vdd of 1.8V is the less than its gate voltage of 3.6V. Because the NMOS transistor TN5 is ON and the PMOS transistor TP5 is OFF, the voltage at node S1 is approximately the same as the voltage Vdd of 1.8V applied to the source of the ON NMOS transistor TN5.

When the true input of the level converter circuit 105 at node S3 changes from low to high, i.e., becomes 1.8V, and the complement input at node S2 becomes low, i.e., 0V, then the output at node S1 becomes high at 3.6V, as described below. When the voltage as S3 is high at 1.8V, TN1 turns ON since its gate voltage of 1.8V is larger than its source voltage of 0V. The ON first NMOS transistor TN1 switches ON the second NMOS transistor TN2 and draws current in the path TP1-TP2-TN2-TN1 of the first stack 120.

The second NMOS transistor TN2 limits the drain voltage of the first NMOS transistor TN1 to Vdd-Vt, where Vt is the threshold voltage of the NMOS transistors TN1, TN2, which is approximately equal to 0.3V. Thus, the voltage at the drain of TN1, which is connected to the source of TN2, is approximately 1.5V. The second NMOS transistor TN2 is ON because the voltage at its gate (1.8VDC) is higher than the voltage at its source, which is approximately 1.5V in this example.

Note, the first PMOS transistor TP1 of the first stack 120 is always ON, since its gate voltage of 1.8VDC (Vdd) is less than its source voltage of 3.6VDC (OVdd). When the true input node S3 is 1.8V, the voltage at the gate of the second PMOS transistor TP2 of the first stack 120, which is the complement input node S2, is 0V. This turns ON the second PMOS transistor TP2 because its gate is at a lower voltage than its source voltage.

The strengths of the first stack 120 of all four transistors TP1, TP2, TN1, TN2 are designed such that the voltage to the gates of transistors TP5, TN5 of the second stack 125 falls from 3.6V to 1.8V when the first stack input voltages of 0V, 1.8V on nodes S3, S2 respectively, change to 1.8V, 0V. The strength of each transistor is determined by its size, in particular, by the ratio of its channel width to length ratio (W/L).

The transistors TP5, TN5 of the second stack 125 invert the 1.8V level on their gates to OVdd of 3.6V as follows. The voltage at node S1 is 3.6V when 1.8V is applied to the gates of the second stack transistors TP5, TN5 because the PMOS transistor TP5 is ON and the NMOS transistor TN5 is OFF. The PMOS transistor TP5 of the second stack 125 is ON, since its source voltage OVdd of 3.6V is the greater than its gate voltage of 1.8V. The NMOS transistor TN5 of the second stack 125 is OFF, since its source voltage Vdd of 1.8V is the same as its gate voltage. Because the NMOS transistor TN5 is OFF and the PMOS transistor TP5 is ON, the voltage at node S1 is approximately the same as the voltage OVdd of 3.6V applied to the source of the ON PMOS transistor TP5.

The third stack 130 of the I/O interface circuit 110 operates in a manner similar to the first stack 120 of the level converter circuit 105. In particular, its output signal at the I/O output node S5, which is connected to the I/O pad 115, is high (3.6V) when the signal at node S1 is low (1.8V), and the signal at node S4 is low (0V). Similarly, when the signal at node S1, is high (3.6V), and the signal at node S4 is high (1.8V), then the output signal at the I/O output node S5 is low (0V), as follows.

The 1.8V level at node S1 turns ON the TP3 transistor, while the 0V level at node S4 turns OFF the TN3 transistor. Similar to the first stack 120, the OFF NMOS transistor TN3 prevents current flow down the third stack 130. Thus, the OVdd voltage level connected to the source of the ON TP3 transistor provides the high voltage level of 3.6V at node S5 which is connected to the input to the I/O pad 115. Note, the TP4 transistor is also ON since the voltage level of 1.8VDC is less than its source voltage level of 3.6V, which is provided through the ON TP3 transistor.

When the inputs of the third stack 130 at nodes S1, S4, go high, than the voltage at the output node S5 goes low to 0V as follows. The 3.6V level at node S1 turns OFF the TP3 transistor, because its source and gate are at the same voltage level. This also turns OFF the TP4 transistor. The 1.8V level at node S4 turns ON the TN3 transistor, which also turns ON the TN4 transistor, as described in connection with the first and second NMOS transistors of the first stack 120. This connects the node S5 to ground and pulls down the 3.6V level on node S5 to 0V.

In summary, the conventional voltage translation circuit 100 translates the 0V and 1.8V voltage levels of the input signal at node S2 (and its complement at node S3) to new voltage levels at node S5, namely, 3.6V and 0V.

The conventional voltage translation circuit 100 suffers from a number of drawbacks. One disadvantage of the conventional voltage translation circuit 100 is that the first stack 120 of the conventional level converter circuit 105 consumes large amounts of power. This is because current I continuously flows through the four transistors TP1, TP2, TN2, TN1 of the first stack 120 when node S3 is high (1.8V), resulting in unwanted power dissipation.

Furthermore, this unwanted DC power dissipation is directly proportional to a desired performance, such as speed, of the I/O of the conventional voltage translation circuit 100. For example, to achieve a higher desired speed, a larger undesired current flowing through the four transistors TP1, TP2, TN2, TN1 of the first stack 120 is required. Thus, there is a direct tradeoff between switching speed and DC power dissipation.

Another disadvantage is that the ratio of strengths of the four transistors TP1, TP2, TN2, TN1 of the first stack 120 is critical in order to guarantee that the voltage on the gates of transistors TP5, TP5 of the second stack 125 is within an acceptable range of Vdd, e.g., 1.8V, when S3 is high and current I is flowing down the first stack 120. That is, the four transistors TP1, TP2, TN2, TN1 of the first stack 120 must be properly fabricated to provide a desired voltage division, namely, to provide 1.8V at the gates of transistors TN5, TP5 of the second stack 125 when the voltage at node S3 is high and current I is flowing down the first stack 120. This requirement results in tighter manufacturing tolerances than otherwise necessary for the conventional level converter circuit 100 to function properly.

SUMMARY OF THE INVENTION

The object of the present invention is to provide a voltage translation circuit that eliminates the problems of conventional voltage translation circuits.

Another object of the present invention is to provide a voltage translation circuit that consumes low DC power.

Yet another object of the present invention is to provide a voltage translation circuit that is easy to manufacture.

A further object of the present invention is to provide a voltage translation circuit that does not require critical device strength matching since no critical voltages are generated using device dimensions, thus relaxing manufacturing tolerances.

These and other objects of the present invention are achieved by a voltage translation circuit, also referred to as a level converter circuit, for translating signals from a first voltage range to a second voltage range. The level converter circuit comprises a first inverter having an input that receives an intermediate signal and an output that provides an output signal having voltage levels that are latched to high and low states of the second voltage range; and a second inverter having an input connected to the first inverter output and an output connected to the first inverter input.

A capacitor having an input that receives an input signal of the first voltage range and an output that provides the intermediate signal of the second voltage range is also provided. In addition, a pair of diodes are connected in series between a pair of voltage sources that provides high and low states of the second voltage range. The interconnected terminals of the pair of diodes are connected to the output of the capacitor.

The first inverter includes a first pair of transistors having a pair of interconnected input terminals and a pair of interconnected output terminals. Similarly, the second inverter includes a second pair of transistors having a pair of interconnected control terminals and a pair of interconnected intermediate terminals.

An input node that receives input signals of the first voltage range is connected to the pair of interconnected input terminals and to the pair of interconnected intermediate terminals. An output node that provides output signals of the second voltage range is connected to the pair of interconnected output terminals and to the pair of interconnected control terminals.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 2:
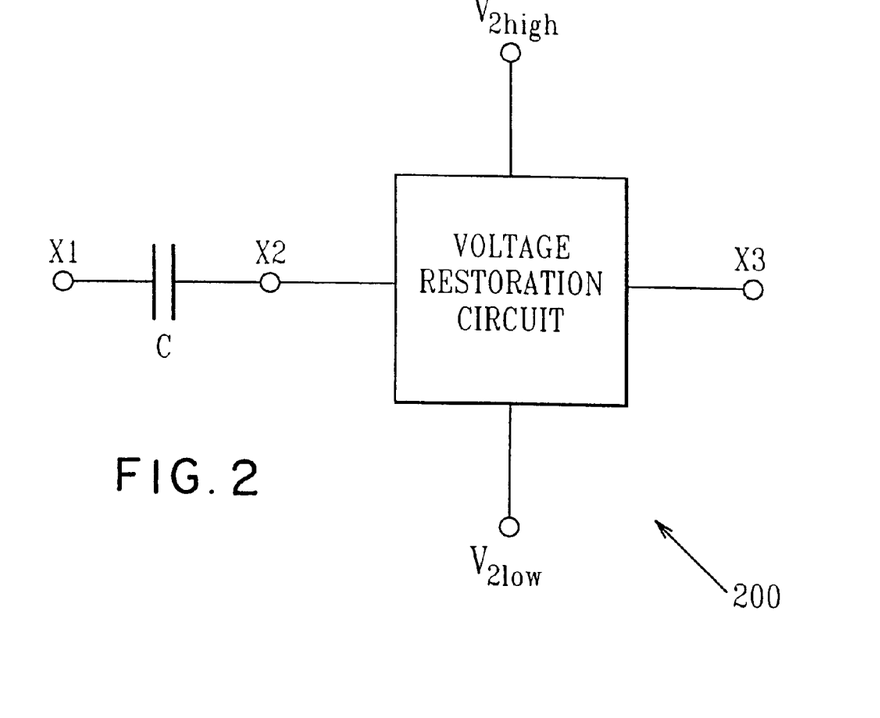
FIG. 2 shows a block diagram of a voltage translation circuit according to the present invention.

FIG. 2 shows a block diagram of voltage translation circuit 200, also referred to as a level converter circuit, according to the present invention. The voltage translation circuit 200 includes a capacitor C having an input terminal connected to an input node X1, and an output connected to an intermediate node X2. The intermediate node X2 is also connected to a voltage restoration circuit 205. The output of the voltage restoration circuit 205 is connected to an output node X3 and is biased between two DC voltage levels $V_{2high}$, $V_{2low}$.

Figure 3:
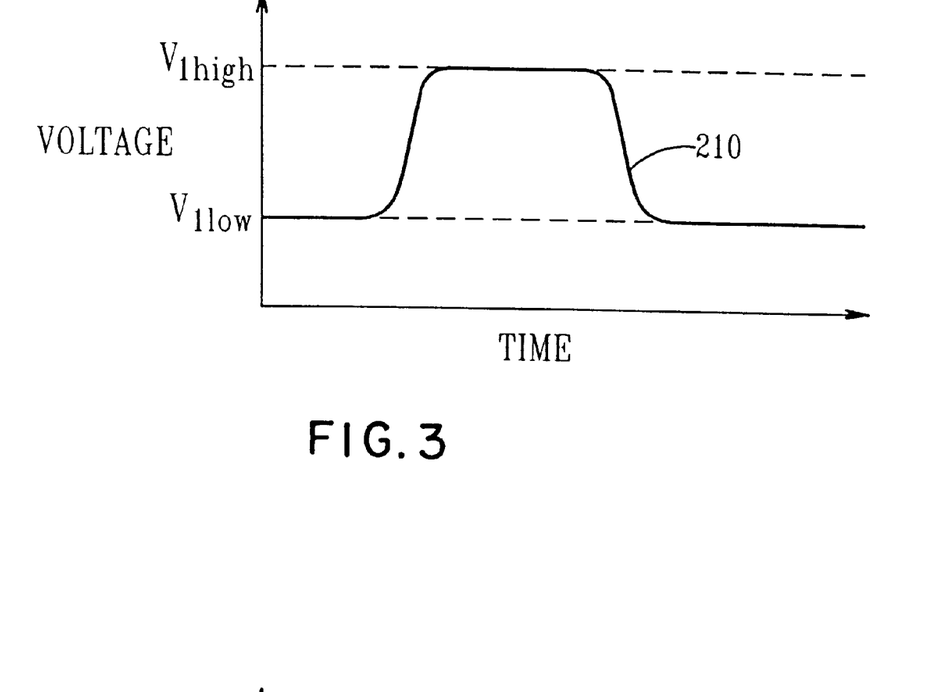
FIGS. 3 and 4 show input and output waveforms of the voltage translation circuit of FIG. 2, respectively, according to the present invention.
Figure 4:
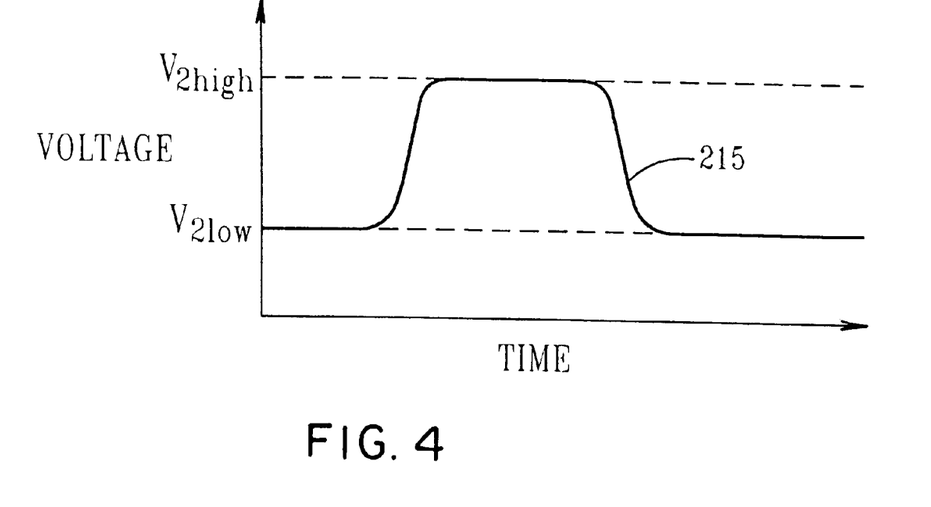

FIGS. 3 and 4 show input and output waveforms 210, 215 at the input and output nodes X1, X3 respectively. As shown in FIG. 3, the input waveform 210 has a low state designated as $V_{1low}$ and a high state designated as $V_{high}$. Similarly, as shown in FIG. 4, the low state of the output waveform 215 is the voltage level of the low DC bias $V_{2low}$ of the voltage restoration circuit 205 (FIG. 2), while the high state of the output waveform 215 is the voltage level of the high DC bias $V_{2high}$ of the voltage restoration circuit 205.

In effect, the voltage translation circuit 200 translates signals from a first voltage range of $V_{2low}$ to $V_{1high}$, to a second voltage range of $V_{2low}$ to $V_{2high}$.

The input signal 210 is applied to the input node X1 shown in FIG. 2. In response, the capacitor C provides an intermediate signal to the intermediate node X2, which is connected to the voltage restoration circuit 205. The intermediate signal at the intermediate node X2, is similar to the output signal 215 at the output node X3, and ranges from $V_{2low}$ to $V_{2high}$, except that the low and high levels $V_{2low}$ to $V_{2high}$ of the output signal 215 are latched by the voltage restoration circuit 205 to provide stable low and high levels $V_{2low}$, $V_{2high}$ of the output signal 215.

The voltage restoration circuit 205 includes a latch which is operated between voltage levels of the second voltage range of $V_{2low}$ to $V_{2high}$. The voltage restoration circuit 205 receives the intermediate signal from the capacitor C and latches the high and low voltage levels $V_{2low}$, $V_{2high}$ of the intermediate signal to provide the output signal 215. The output signal 215 has stable voltage levels that are the latched high and low levels $V_{2low}$, $V_{2high}$.

Figure 5:
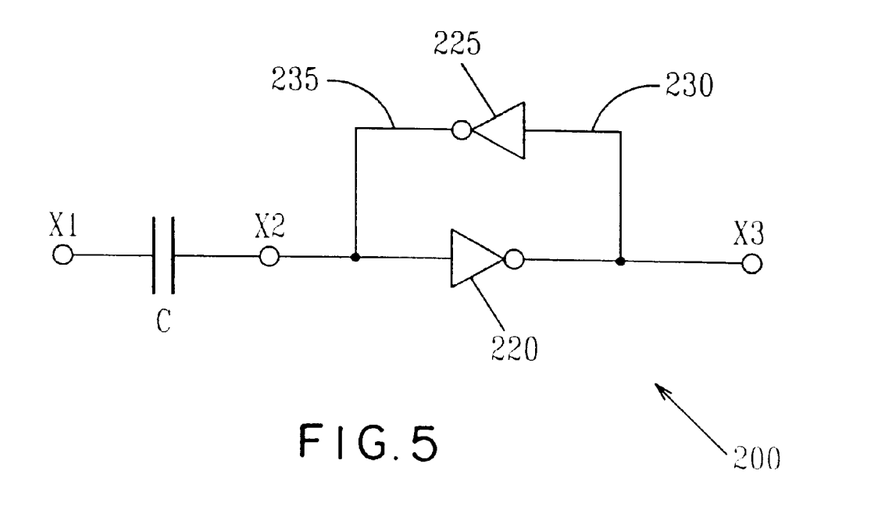
FIG. 5 shows a circuit diagram of the voltage translation circuit of FIG. 2 according to the present invention.
Figure 6:
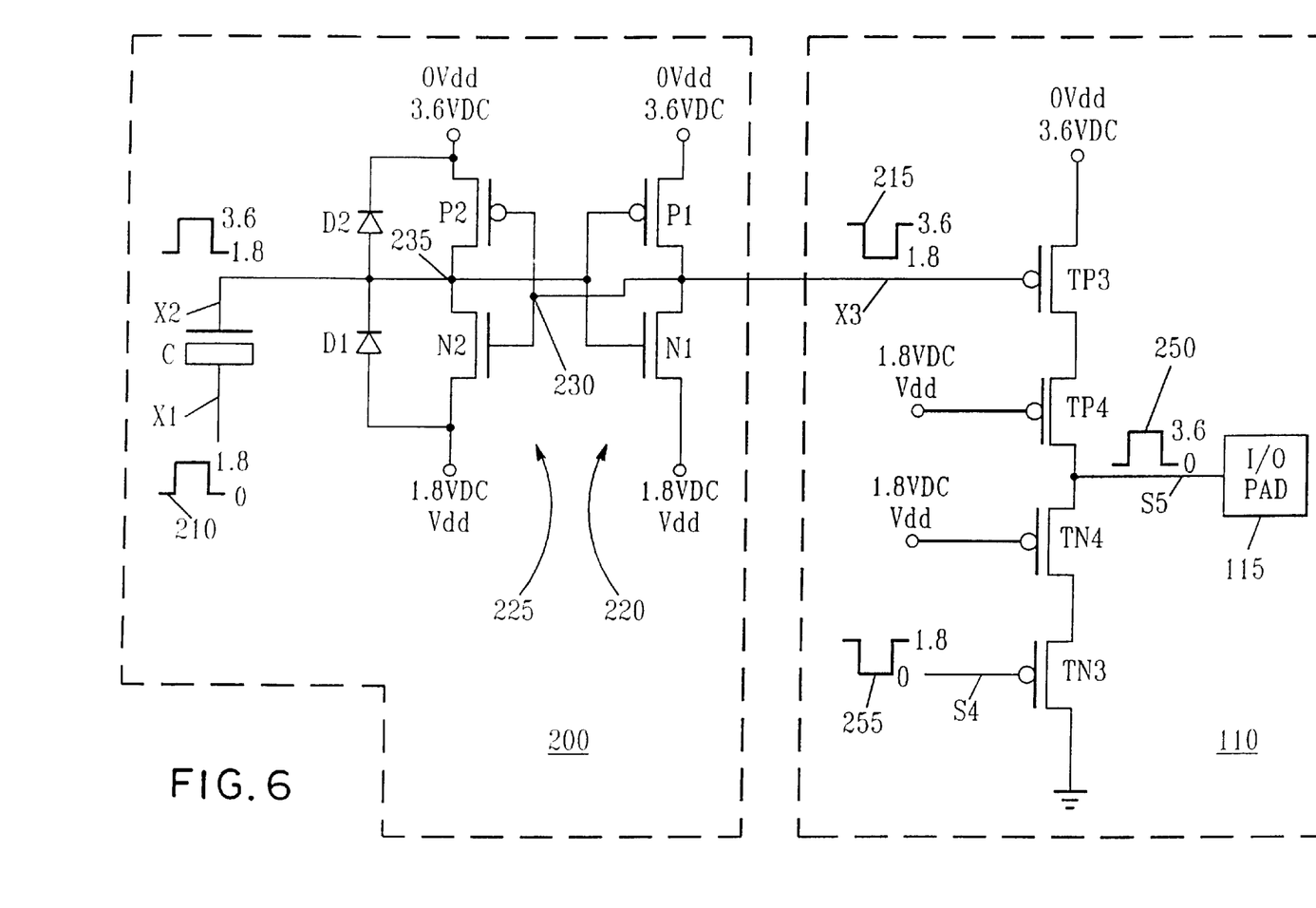
FIG. 6 shows the circuit diagram of the voltage translation circuit of FIG. 4 in greater detail according to the present invention.

FIGS. 5 and 6 show a circuit diagram of the voltage translation circuit 200 in increasing detail. For illustration purposes, the input voltage range levels $V_{1low}$, $V_{1high}$ are 0 volts (V) and 1.8V, respectively, while the output voltage range levels $V_{2low}$, $V_{2high}$ are 1.8, 3.6V, respectively. However, it is understood that throughout the specification, the numerical values for the voltages are illustrative only, where other values may also be substituted therefor.

For example, instead of the output signal ranging from 1.8 to 3.6V at the output node X3, other voltage ranges are possible. Similarly, instead of the input signal ranging from 0V to 1.8V at nodes X1 and S4 (FIG. 6), other voltage values such as a signal ranging from −1.8V to 0V may be used. It is noteworthy that the conventional voltage translation circuit 100 of FIG. 1 cannot operate using different voltage ranges without additional circuitry. For example, the conventional voltage translation circuit 100 of FIG. 1 cannot operate with signals ranging from −1.8V to 0V at nodes S2, S3, S4, instead of 0V to 1.8V. This is because the total voltage range from $V_{1low}$ to $V_{2high}$ must be supported by the series of MOSFETs TN1, TN2, TP1, TP2 of the conventional level converter circuit 105, and thus is restricted to at most four times the maximum allowable voltage on a single MOSFET.

As shown in FIG. 5, the capacitor C of the voltage translation or restoration circuit 200, has one terminal connected to the input node X1, and another terminal connected to the intermediate node X2. The input of a first inverter 220 is connected to the intermediate node X2, and the first inverter output is connected the output node X3. A feedback inverter 225 is connected between the output and intermediate node X3, X2. In particular, the input of the feedback inverter 225 is connected to the output node X3, and the feedback inverter output is connected to the intermediate node X2.

FIG. 6 shows a detailed circuit of the voltage translation circuit 200. As shown in FIG. 6, each inverter 220, 225 is formed by a pair of transistors. Illustratively, the first pair of transistors of the first inverter 220 includes PMOS and NMOS transistors P1, N1, and the second pair of transistors of the second or feedback inverter 225 also includes PMOS and NMOS transistors P2, N2.

The gates of the first PMOS and NMOS transistors P1, N1 are interconnected to form the input of the voltage restoration or translation circuit 200. That is, these interconnected gates are connected to the intermediate node X2, which is also connected to the capacitor C. The drains of the first PMOS and NMOS transistors P1, N1 are interconnected to form the output of the voltage restoration circuit 205. That is, these interconnected drains are connected to the output node X3. The output node X3 may be connected to other circuits, such as the I/O interface circuit 110 described in connection with FIG. 1.

The gates of the second PMOS and NMOS transistors P2, N2 are interconnected to form an input to the second or feedback inverter 225, which input is also referred to as a control or feedback terminal 230. This control terminal 230 is connected to the output node X3. The drains of the second PMOS and NMOS transistors P2, N2 are interconnected to form intermediate terminal 235. This intermediate terminal 235 is connected to the intermediate node X2.

The sources of the PMOS transistors P1, P2 are connected to a first DC voltage source, to provide a voltage level of OVdd, such as 3.6VDC for example. The sources of the NMOS transistors N1, N2 are connected to a second DC voltage source, to provide a voltage level of Vdd, such as 1.8VDC for example.

A pair of diodes D1, D2, are connected in series between the two DC voltage sources. The interconnected terminals of the diodes D1, D2 are connected to the intermediate node X2. For example, the anode of the first diode D1 is connected to the 1.8VDC power supply, while the cathode of the second diode D2 is connected to the 3.6VDC power supply. The cathode of the first diode D1 is connected to the anode of the second diode D2 to form the interconnected terminals of the diodes D1, D2.

The operation of the voltage translation circuit 200, is now described. The input signal 210, also shown in FIG. 3, is applied to the input node X1, where $V_{1low}$ is 0V and $V_{1high}$ is 1.8V, for example. The voltage translation circuit 200 is initialized to provide 1.8V at the intermediate node X2 when the input signal 210 is 0v.

On power up, the voltage at the intermediate node X2 may be set in the wrong state, e.g., in the high state of 3.6V, when the input signal 210 is in the low state of 0V. However, proper initialization is achieved automatically by cycling the input signal 210 from the low state of 0V to the high state of 1.8V, and back to the low state of 0V. The diodes D1, D2 clamp the voltage at the intermediate node X2 into the proper state, i.e, to Vdd (1.8V) when the input signal 210 is low ($V_{1low}$=0V), or to OVdd (3.6V) when the input signal 210 is high ($V_{1high}$=1.8V) as described below.

After this initialization, the translated voltage levels at the intermediate and output nodes X2, X3 are synchronized with the input signal 210 at the input node X1. As will be apparent, when the input signal 210 is low at 0V ($V_{1low}$), the intermediate signal at the intermediate node X2 is at the translated low state of 1.8V ($V_{2low}$), while the output signal 215 at the output node X3 is at the translated high state of 3.6V ($V_{2high}$). Conversely, when the input signal 210 is high at 1.8V ($V_{1high}$), the intermediate signal at the intermediate node X2 is at the translated high state of 3.6V ($V_{2high}$), while the output signal 215 at the output node X3 is at the translated low state of 1.8V ($V_{2low}$).

Once the voltage translation circuit 200 is initialized where the input signal 210 at the input node X1 is 0V, the capacitor C is charged to 1.8V since the first diode D1 conducts to provide the 1.8V level of the Vdd power supply to the intermediate node X2. The first diode D1 conducts because its cathode is at a 0V potential of the input signal 210, which is lower than the 1.8V potential at its anode from the Vdd power supply.

The voltage level of 1.8V at the intermediate node X2, which is also connected to the gates of the first PMOS and NMOS transistors P1, N1, turns ON the first PMOS transistor P1, and turns OFF the first NMOS transistors N1. The turned ON first PMOS transistor P1 provides the 3.6V (OVdd) voltage level of its source to the output node X3, which is connected to its drain. Because the first NMOS transistors N1 is OFF, no current flows through the stack or inverter 220 formed by the two series connected first PMOS and NMOS transistors P1, N1. That is, no DC power is dissipated by the inverter 220 when the input signal 210 is low at 0V. Rather, all the current from the OVdd power supply of 3.6VDC flows to the output of the inverter 220 at the output node X3 to provide the $V_{2high}$ voltage level of the output signal 215.

Similarly, there is no DC power dissipated by the feedback inverter 225, because the second PMOS transistor P2 is OFF when the input signal 210 is low at 0V. The second PMOS transistor P2 is OFF since its gate, which is connected to the output node X3, is at a voltage level of 3.6V, which is the same voltage level at its source. In this case, where the voltage levels at the input and output nodes X1, X3 are 1.8V and 3.6V, respectively, the second NMOS transistor N2 is ON, since its gate voltage level of 3.6V is higher than is source voltage of 1.8V (Vdd).

When the voltage level of the input signal 210 at the input node X1 increases from 0V ($V_{1low}$) to 1.8V($V_{1high}$), the capacitor C charges up by 1.8V. The capacitor C capacitively increase the voltage level at the intermediate node X2 by (1.8−Δ)V, where Δ is a voltage loss due to the capacitor C. Thus, the voltage level at the intermediate node X2 increases from 1.8V to [1.8+(1.8−Δ)]V, i.e., to slightly less than 3.6V.

Because the voltage level of the gates (which are connected to the intermediate node X2 )of the first PMOS and NMOS transistors P1, N1 is approximately 3.6V, the first PMOS transistor P1 almost turns OFF, and the first NMOS transistors N1 turns ON. The turned ON first NMOS transistor N1 decreases the voltage level at the output node X3 from 3.6V to 1.8V. That is, the first inverter 220 inverts and translates the input signal 210 at the input node X1 that increases from 0V to 1.8V, to provide the output signal 215 at the output node X3 that decreases from 3.6V (OVdd) to 1.8V (Vdd).

The translated low voltage level $V_{2low}$ of 1.8V at the output node X3 lowers the voltage level at the gates of the second PMOS and NMOS transistors P2, N2. This is because the gates of the second PMOS and NMOS transistors P2, N2, which gates are the input of the second or feedback inverter 225 formed by the second PMOS and NMOS transistors P2, N2, are connected to the output node X3.

This low voltage level $V_{2low}$ of 1.8V at gates of the second PMOS and NMOS transistors P2, N2, turns OFF the second NMOS transistors N2, and turns ON the second PMOS transistors P2. The turned ON second PMOS transistors P2 fully drives the voltage level at the intermediate node X2, from the slightly less than 3.6V level of $[1.8+(1.8-\Delta)]V$ to 3.6V. Now, this 3.6V level at the intermediate node X2, which is also the level at the gate of the first PMOS transistor P1, fully turns OFF the first PMOS transistor P1.

Because the first PMOS transistor P1 is OFF, no current flows through the stack or inverter 220 formed by the two series connected first PMOS and NMOS transistors P1, N1. That is, no DC power is dissipated by the inverter 220. Rather, all the current from the Vdd power supply of 1.8V flows to the output of the inverter 220 at the output node X3 to provide the $V_{2low}$ voltage level of the output signal 215, when the input signal 210 is high at 1.8V.

Similarly, there is no DC power dissipated by the feedback inverter 225, because the second NMOS transistor N1 is OFF. The second NMOS transistor N2 is OFF since its gate, which is connected to the output node N3, is at a voltage level of 1.8V, which is the same voltage level at its source.

A subsequent transition of the input signal 210 from 1.8V ($V_{1high}$) back to 0V ($V_{1low}$) will result in the capacitor C capacitively coupling a voltage level of $1.8+\Delta V$, which is slightly larger than 1.8V, to the input of the first inverter 200 (i.e., to the gates of the first PMOS and NMOS transistors P1, N1) at the intermediate node X2. The $1.8+\Delta V$ results from the reduction of the 3.6V level at the intermediate node X2 by the 1.8V transition of the input signal 210 from 1.8V to 0V minus a voltage loss $\Delta V$ of the capacitor, i.e., $[3.6-(1.8-\Delta)]V=1.8+\Delta V$).

As previously described, the voltage level of approximately 1.8V at the intermediate node X2, turns ON the first PMOS transistors P1, and almost turns OFF the first NMOS transistors N1 to provide the translated high level $V_{2high}$ (3.6V) of the output signal 215 at the output node X3.

This translated high level $V_{2high}$ of 3.6V at the output node X3, which is also the voltage level at the gates of the second PMOS and NMOS transistors P2, N2 (or the voltage level at the input of the feedback inverter 225), turns OFF the second PMOS transistors P2, and turns ON the second NMOS transistors N2. The OFF second PMOS transistors P2 prevents DC power dissipation by the second or feedback invertor 225.

The ON second NMOS transistors N2 fully drives the voltage at the intermediate node X2, which is also the voltage at the gate of the first NMOS transistor N1, from $1.8+\Delta V$ to 1.8V. The 1.8V level at the gate of the first NMOS transistor N1 fully turns OFF the first NMOS transistor N1 and prevents DC power dissipation by the first invertor 220.

Thus, the voltage translation circuit 200 fully translates an input signal having voltage levels of $V_{1low}$, $V_{1high}$, e.g., 0, 1.8V, to a new set of voltage levels $V_{2low}$, $V_{2high}$, e.g., 1.8, 3.6V without using any DC power. Furthermore, unlike the conventional voltage translation circuit 100 of FIG. 1, since transistors of the inverters 220, 225 need not provide critical DC voltages, no critical device strength matching is required. Thus, the inventive voltage translation circuit 200 has wider manufacturing tolerances, allowing simpler manufacturing and increasing yield.

Various circuits may be connected to the output node X3 of the voltage translation circuit 200. For example, the I/O interface circuit 110, described in connection with FIG. 1, translates the output signal 215 to an I/O pad signal 250 that ranges from 0V to 3.6V. The I/O interface circuit 110 operates in a fashion similar to that described in connection with FIG. 1. In FIG. 6, the inputs of the I/O interface circuit 110 at nodes X3 and S4 are the complements of the signals at nodes S1 and S4 of FIG. 1.

When the output signal 215 is high at 3.6V, the PMOS transistors TP3, TP4 of the I/O interface circuit 110 are OFF. The high 1.8V voltage level of the I/O signal 255 at node S4 turns ON the NMOS transistors TN3, TN4 of the I/O interface circuit 110. This provides the low voltage level of 0V of the I/O pad signal 250.

When the I/O signal 255 at node S4 is low at 0V, the NMOS transistors TN3, TN4 of the I/O interface circuit 110 are OFF. The low 1.8V level of the output signal 215 at node X3 turns ON the PMOS transistors TP3, TP4 of the I/O interface circuit 110. This provides the high voltage level of 3.6V of the I/O pad signal 250.

Illustratively, the inventive voltage translation circuit 200 is implemented using silicon on insulator (SOI). The MOSFET bodies, which are P and/or N wells, are isolated. Diodes may be added by providing P-N junctions. Alternatively, the bodies of the first PMOS and NMOS transistors P1, N1 may be electrically connected to 0Vdd and Vdd, respectively.

For example, in standard bulk CMOS (N-well on P-substrate), the second diode D2 is a parasitic diode that is automatically provided by the P-N junction between the P+ drain of the second PMOS transistor P2 and the N-well. In this case, the first diode D1 is explicitly provided, and the second diode D2 is incorporated into the second PMOS transistor P2 by electrically connecting the N-well of the second NMOS transistor N2 to 0Vdd.

In triple-well CMOS, where an isolated P-well is provided in addition to the usual N-well in the P-type epitaxial layer, the first diode D1 is made part of the second NMOS transistor N2 by electrically connecting the normally isolated P-well of the second NMOS transistor N2 to Vdd.

The first PMOS and NMOS transistors P1, N1 of the forward inverter 220 are fabricated to form a fast inverter. That is, the first PMOS and NMOS transistors P1, N1 are short and wide transistors for high drive. In contrast, the second PMOS and NMOS transistors P2, N2 of the feedback inverter 225 are fabricated to form a weak and slow inverter. That is, the second PMOS and NMOS transistors P2, N2 have narrow and long channels.

Capacitor C has a capacitance $C_1$ which is large enough to charge the gate capacitance of the third PMOS transistor P3 of the I/O interface circuit 110, which gate is connected to the output node X3, for example. In addition, the capacitance $C_1$ of capacitor C is large enough to overcome drive currents from the second PMOS and NMOS transistors P2, N2 during switching.

As long as the capacitance $C_1$ of capacitor C is much larger than the latch input capacitance, and the feedback drivers P2, N2 of the latch are relatively weak, the capacitive coupling reliably drives the input level from the input voltage swing of 0–1.8V to the translated level of 1.8–3.6V. Full level restoration is always guaranteed by the feedback drivers P2, N2 and therefore, the cut-off current in standby is equal to that of conventional complementary circuits without mixed voltage. If necessary, arbitrary slow pulse shapes coming into the capacitor C can be made sharp by the addition of one or more inverters ahead of the input capacitor C.

In particular, the capacitance $C_1$ of capacitor C is chosen to satisfy the equations (1) and (2) as follows:

$$C_1 \gg C_{N1}+C_{P1}+I_{N2}/(dV/dt) \quad (1)$$

$$C_1 \gg C_{N1}+C_{P1}+I_{P2}/(dV/dt) \quad (2)$$

where, $C_{N1}$, $C_{P1}$ are the input capacitances of the first NMOS and PMOS transistors N1, P1 in the voltage translation circuit 200, respectively;

dV/dt is the rate of change of the switching voltage on capacitor C; and $I_{N2}$ and $I_{P2}$ are the drive currents of the second PMOS and NMOS transistors N2, P2, respectively.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. An apparatus for translating signals from a first voltage range to a second voltage range and then to a third voltage range comprising:

a capacitor having an input that receives an input signal of said first voltage range and an output that provides an intermediate signal of said second voltage range;

a voltage restoration circuit that receives said intermediate signal and latches high and low states of said second voltage range of said intermediate signal to provide an output signal having said latched high and low states of said second voltage range; and an interface circuit that translates said intermediate signal of said second voltage range to a third voltage range, said interface circuit providing expanded input signal and voltage range.

2. The apparatus of claim 1, wherein said voltage restoration circuit comprises:

a first pair of transistors having interconnected input terminals and interconnected output terminals, said interconnected input terminals being connected to said capacitor and said interconnected output terminals providing said output signal;

a second pair of transistors having interconnected control terminals and interconnected intermediate terminals, said interconnected intermediate terminals being connected to said capacitor and to said interconnected input terminals, and said interconnected control terminals being connected to said interconnected output terminals;

said input and output pairs of transistors being connected to first and second voltage sources that supply said high and low states of said second voltage range.

3. The apparatus of claim 1, wherein said voltage restoration circuit has a pair of bias terminals that are connected to a pair of voltage sources for providing voltage levels of said high and low states.

4. The apparatus of claim 3 further comprising a pair of diodes connected in series between said pair of voltage sources, wherein interconnected terminals of said pair of diodes are connected to the output of said capacitor.

5. A level converter circuit comprising:

a capacitor having an input that receives an input signal of a first voltage range and an output that provides an intermediate signal of a second voltage range;

a first inverter having an input that receives said intermediate signal and an output that provides an output signal having voltage levels that are latched to high and low states of said second voltage range; and a second inverter having an input connected to said first inverter output and an output connected to said first inverter input; and an interface circuit for translating the second voltage range of said output signal to a third voltage range, said interface circuit providing expanded input signal and voltage range and having an interface input connected to said first inverter output and an interface output for providing interface output signals of the third voltage range.

6. The level converter circuit of claim 5, wherein each of said first and second inverters has a pair of bias terminals that are connected to a pair of voltage sources for providing voltage levels of said high and low states.

7. The level converter circuit of claim 6 further comprising a pair of diodes connected in series between said pair of voltage sources, wherein interconnected terminals of said pair of diodes are connected to the output of said capacitor.

8. A voltage translation circuit for translating signals from a first voltage range to a second voltage range, comprising:

an input node that receives input signals of the first voltage range;

an output node that provides output signals of the second voltage range;

a first pair of transistors having a pair of interconnected input terminals and a pair of interconnected output terminals;

a second pair of transistors having a pair of interconnected control terminals and a pair of interconnected intermediate terminals; and an interface circuit for translating the second voltage range of said output signals to a third voltage range, said interface circuit providing expanded input signal and voltage range and having an interface input connected to said output node and an interface output for providing interface output signals of the third voltage range;

said input node being connected to said pair of interconnected input terminals and to said pair of interconnected intermediate terminals, and said output node being connected to said pair of interconnected output terminals and to said pair of interconnected control terminals.

9. The voltage translation circuit of claim 8 further comprising a capacitor connected in series between said input node and said pair of interconnected input terminals of said first pair of transistors.

10. The voltage translation circuit of claim 8, wherein each of said first and second transistor pairs has a pair of bias terminals that are connected between first and second voltages.

11. The voltage translation circuit of claim 10 further comprising a pair of diodes connected in series between said first and second voltage sources, wherein interconnected terminals of said pair of diodes are connected to said input node.

12. The voltage translation circuit of claim 10, wherein said second voltage range is from a first voltage of said first voltage source and a second voltage of said second voltage source.

13. The voltage translation circuit of claim 8, wherein said first pair of transistors are PMOS and NMOS transistors, sources of said PMOS and NMOS transistors being connected to first and second voltage sources, respectively, drains of said PMOS and NMOS transistors being said pair of interconnected output terminals, and gates of said PMOS and NMOS transistors being said pair of interconnected input terminals.

14. The voltage translation circuit of claim 8, wherein said second pair of transistors are PMOS and NMOS transistors, sources of said PMOS and NMOS transistors being connected to first and second voltage sources, respectively, drains of said PMOS and NMOS transistors being said pair of interconnected intermediate terminals, and gates of said PMOS and NMOS transistors being said pair of interconnected control terminals.

15. The apparatus of claim 2, wherein said interface circuit receives said voltage restoration circuit output signal and an interface output for providing interface output signals of the third voltage range to a pad.

16. The voltage translation circuit of claim 8, wherein said interface circuit is connected between a first voltage source and a second voltage source, and wherein said interface output signals of the third voltage range have voltage levels of a first voltage level of said first voltage source and a second voltage level of said second voltage source.

* * * * *